(12) United States Patent
Tsuda et al.

(10) Patent No.: US 12,397,323 B2
(45) Date of Patent: Aug. 26, 2025

(54) SUBSTRATE CLEANING DEVICE AND SUBSTRATE CLEANING METHOD

(71) Applicant: SCREEN HOLDINGS CO., LTD., Kyoto (JP)

(72) Inventors: Shotaro Tsuda, Kyoto (JP); Ryohei Hokaku, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 81 days.

(21) Appl. No.: 18/357,717

(22) Filed: Jul. 24, 2023

(65) Prior Publication Data

US 2024/0033782 A1    Feb. 1, 2024

(30) Foreign Application Priority Data

Jul. 27, 2022    (JP) .................................. 2022-120008

(51) Int. Cl.
  *B08B 1/12*      (2024.01)
  *B08B 3/04*      (2006.01)
  *B08B 5/04*      (2006.01)

(52) U.S. Cl.
  CPC .................. *B08B 1/12* (2024.01); *B08B 3/04* (2013.01); *B08B 5/04* (2013.01)

(58) Field of Classification Search
  CPC ....................................................... B08B 1/12
  See application file for complete search history.

(56) References Cited

U.S. PATENT DOCUMENTS

2008/0199283 A1    8/2008    Mitsuyoshi

FOREIGN PATENT DOCUMENTS

| JP | 04-030521 A | 2/1992 |
| JP | 09-232212 A | 9/1997 |
| JP | 2008-198884 A | 8/2008 |
| JP | 2012-043836 A | 3/2012 |
| JP | 2012-060137 A | 3/2012 |
| JP | 5004612 B2 | 8/2012 |
| JP | 5293790 B2 | 9/2013 |
| JP | 5440441 B2 | 3/2014 |
| JP | 2021-093427 A | 6/2021 |

*Primary Examiner* — Jason Y Ko
(74) *Attorney, Agent, or Firm* — OSTROLENK FABERR LLP (57) ABSTRACT

A substrate cleaning device includes a substrate holder that holds a substrate, a cleaning brush that is provided to be movable between a cleaning position for cleaning the substrate held by the substrate holder and a waiting position outward of the substrate held by the substrate holder, and has a cleaning surface capable of cleaning the substrate held by the substrate holder, a remover that is configured such that liquid is transferrable to the remover, and a driver that moves at least one of the cleaning brush and the remover with respect to another one such that at least part of liquid adhering to the cleaning surface is transferred to the remover when the cleaning surface and the remover come close to each other at a position outward of a position above the substrate held by the substrate holder, before the substrate is cleaned by the cleaning brush.

13 Claims, 7 Drawing Sheets

SUBSTRATE CLEANING DEVICE AND SUBSTRATE CLEANING METHOD

BACKGROUND

Technical Field

The present invention relates to a substrate cleaning device and a substrate cleaning method.

Description of Related Art

In a substrate cleaning device, a cleaning brush is used to clean a substrate. The cleaning brush described in JP 2021-093427 A is configured to move between a cleaning position where an operation of cleaning a substrate is performed and a waiting position. In the operation of cleaning a substrate, the cleaning brush comes into contact with the substrate while a cleaning liquid is supplied to the substrate held and rotated by a substrate rotation holding device. Thus, the substrate is cleaned. In general, the cleaning brush is cleaned with a rinse liquid at the waiting position after the substrate is cleaned.

SUMMARY

When the cleaning brush is moved from the waiting position to the cleaning position, droplets adhering to the cleaning brush may fall and be splashed on the surface of the substrate held by the substrate rotation holding device. The droplets that are splashed on the surface of the substrate affect the cleanliness of the substrate.

An object of the present invention to provide a substrate cleaning device and a substrate cleaning method that enable cleaning of a substrate so as to obtain a higher level of cleanliness with a simple configuration.

(1) A substrate cleaning device according to one aspect of the present invention includes a substrate holder that holds a substrate, a cleaning brush that is provided to be movable between a cleaning position for cleaning the substrate held by the substrate holder and a waiting position outward of the substrate held by the substrate holder, and has a cleaning surface capable of cleaning the substrate held by the substrate holder, a remover that is configured such that liquid is transferrable to the remover, and a driver that moves at least one of the cleaning brush and the remover with respect to another one such that at least part of liquid adhering to the cleaning surface is transferred to the remover when the cleaning surface and the remover come close to each other at a position outward of a position above the substrate held by the substrate holder, before the substrate is cleaned by the cleaning brush.

(2) A substrate cleaning method according to another aspect of the present invention includes holding a substrate with use of a substrate holder, cleaning a substrate held by the substrate holder with use of a cleaning surface of a cleaning brush, moving at least one of the cleaning brush and a remover with respect to another one such that at least part of liquid adhering to the cleaning surface is transferred to the remover when the cleaning surface and the remover come close to each other at a position outward of a position above the substrate held by the substrate holder, before the substrate is cleaned by the cleaning brush.

With the present invention, it is possible to clean a substrate so as to obtain a higher level of cleanliness with a simple configuration.

Other features, elements, characteristics, and advantages of the present disclosure will become more apparent from the following description of preferred embodiments of the present disclosure with reference to the attached drawings.

DETAILED DESCRIPTION

A substrate cleaning device and a substrate cleaning method according to embodiments of the present invention will be described below in detail with reference to the drawings. In the following description, a substrate refers to a semiconductor substrate (semiconductor wafer), a substrate for an FPD (Flat Panel Display) that is used for a liquid crystal display device, an organic EL (Electro Luminescence) display device or the like, a substrate for an optical disc, a substrate for a magnetic disc, a substrate for a magneto-optical disc, a substrate for a photomask, a ceramic substrate, a substrate for a solar cell, or the like. Further, a substrate, described below, has a circular shape except for a portion in which a notch is formed in a plan view.

(1) SUBSTRATE CLEANING DEVICE

Figure 1:
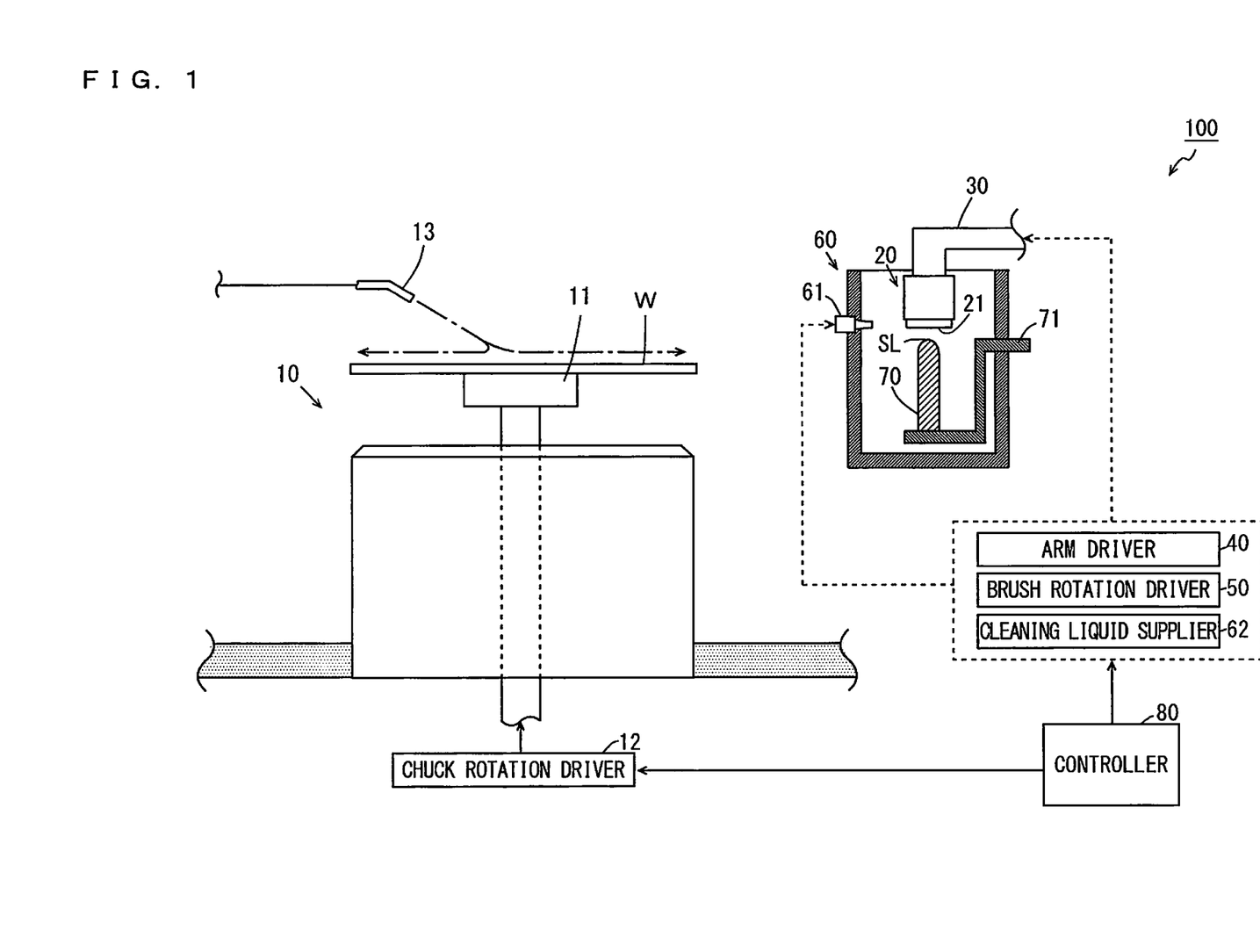
FIG. 1 is a schematic side view of a substrate cleaning device according to one embodiment of the present invention.

FIG. 1 is a schematic plan view of the substrate cleaning device 100 according to one embodiment of the present invention. As shown in FIG. 1, the substrate cleaning device 100 includes a spin chuck 10, a cleaning brush 20, an arm 30, an arm driver 40, a brush rotation driver 50, a waiting pod 60, a remover 70 and a controller 80.

In the substrate cleaning device 100, the substrate W is carried in or out by a transport robot (not shown). The spin chuck 10 includes a holder 11 and a chuck rotation driver 12.

The substrate W carried in by the transport robot is placed on the holder 11. A plurality of suction paths (not shown) are formed in the holder 11. When air inside the suction paths is exhausted, the lower surface of the substrate W is adsorbed under vacuum by the holder 11. Thus, the holder 11 holds the substrate W in a horizontal attitude. The chuck rotation driver 12 is connected to the holder 11 via a connection member. The chuck rotation driver 12 includes an electric motor, for example, and is configured to be capable of rotating the holder 11. Thus, the substrate W held by the holder 11 in a horizontal attitude is rotated.

A cleaning nozzle 13 is provided above the holder 11 and supplies a cleaning liquid toward the upper surface of the substrate W held in a horizontal attitude. The cleaning liquid discharged from the cleaning nozzle 13 spreads outwardly due to a centrifugal force caused by rotation of the substrate W.

The cleaning brush 20 includes a cleaning surface 21 that is opposite to the substrate W held in a horizontal attitude by the holder 11. The cleaning brush 20 is supported by the arm 30 so as to be rotatable about an axis extending in a vertical direction. The cleaning brush 20 is supported by the arm 30 so as to be movable between a cleaning position for cleaning the substrate W held by the holder 11 and a waiting position outward of the substrate W held by the holder 11. While the cleaning brush 20 is formed of polyvinyl alcohol (PVA), for example, the material of the cleaning brush 20 is not limited to this. Another resin material, a ceramic material or the like can be used.

The arm driver 40 includes an actuator, for example, and is configured to be capable of three-dimensionally moving the cleaning brush 20 supported by the arm 30. The brush rotation driver 50 includes an electric motor, for example, and rotates the cleaning brush 20 supported by the arm 30 about the axis extending in the vertical direction. In the present embodiment, the brush rotation driver 50 rotates the cleaning brush 20 in the direction opposite to the direction in which the substrate W held by the holder 11 is rotated. In this state, the rotating substrate W and the rotating cleaning brush 20 come into contact with each other, so that the substrate W is cleaned.

At the waiting position for the cleaning brush 20, the cylindrical waiting pod 60 is provided, for example. The cleaning brush 20 is contained in the waiting pod 60 except when the substrate W is being cleaned. A cleaning nozzle 61 is provided in the waiting pod 60. The cleaning nozzle 61 is connected to the cleaning liquid supplier 62 and discharges a cleaning liquid to the cleaning surface 21 of the cleaning brush 20 that is contained (waiting) in the waiting pod 60. Thus, when the cleaning brush 20 is rotated, the cleaning surface 21 is cleaned. A waste liquid hole (not shown) is formed in the bottom portion of the waiting pod 60, and a waste liquid flow path (not shown) is connected to the waste liquid hole. Thus, the cleaning liquid in the waiting pod 60 is drained.

In the present embodiment, the remover 70 is provided to be located in the waiting pod 60. In the present embodiment, the remover 70 is formed of a hydrophilic material (quartz glass, for example). Thus, liquid adhering to a member close to the remover 70 is likely to be transferred to the remover 70. In the present embodiment, the remover 70 has a shape projecting upwardly and has a tip portion having a hemispherical shape. The shape of the top portion of the remover 70 is not limited to a hemispherical shape and may be another shape. The shape of the tip portion of the remover 70 may have any other shape such as a cone shape, a pyramid shape or a curved shape.

Further, on the surface of the remover 70, a plurality of slits SL that can promote the transfer of liquid from another member due to capillary action are formed by mechanical processing such as sandblasting. In the present embodiment, the plurality of slits are formed in at least the upper end surface of the remover 70. For example, the plurality of slits may be formed to extend from the upper end surface to the side surface of the remover 70.

Further, the remover 70 is connected to an adjustment member 71. The height of the remover 70 with respect to the bottom portion of the waiting pod 60 can be adjusted by the adjustment member 71. In the present embodiment, the height of the remover 70 is fixed after the adjustment member 71 is moved upwardly or downwardly before the substrate cleaning device 100 is used. Thus, the height of the remover 70 is adjusted in advance by a user. Thus, the upper end surface of the remover 70 is fixed at an appropriate height after the adjustment. A specific example of application of the remover 70 will be described below.

The controller 80 includes a CPU (Central Processing Unit), a RAM (Random Access Memory), a ROM (Read Only Memory), a storage device and the like. The controller 80 controls the operations of the chuck rotation driver 12, the arm driver 40, the brush rotation driver 50 and the cleaning liquid supplier 62, described above.

Here, the cleaning brush 20 is moved from the inside of the waiting pod 60 (waiting position) to above the substrate W in order to clean the substrate W held by the holder 11 after being cleaned in the waiting pod 60. At this time, droplets adhering to the cleaning surface 21 of the cleaning brush 20 may fall onto the substrate W. As such, before the substrate W is moved upwardly, an operation of transferring droplets adhering to the cleaning surface 21 of the cleaning brush 20 to the remover 70 is performed. Hereinafter, an operation of transferring droplets adhering to the cleaning surface 21 to the remover 70 is referred to as a transfer operation.

(2) TRANSFER OPERATION OF SUBSTRATE CLEANING DEVICE 100

FIGS. 2 to 5 are schematic cross sectional views for explaining the transfer operation of the substrate cleaning device 100. Note that the arm 30 is not shown in FIGS. 2 to 5.

Figure 2:
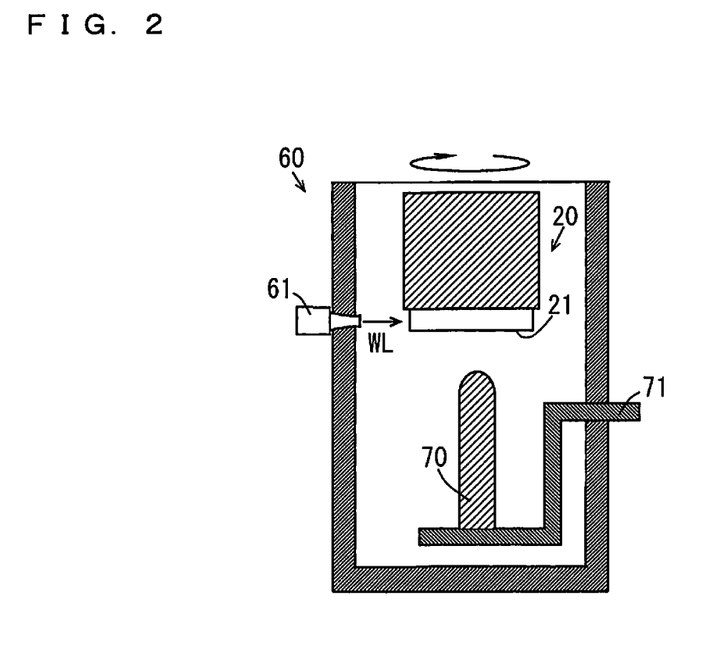
FIG. 2 is a schematic cross sectional view for explaining a transfer operation of the substrate cleaning device.
Figure 3:
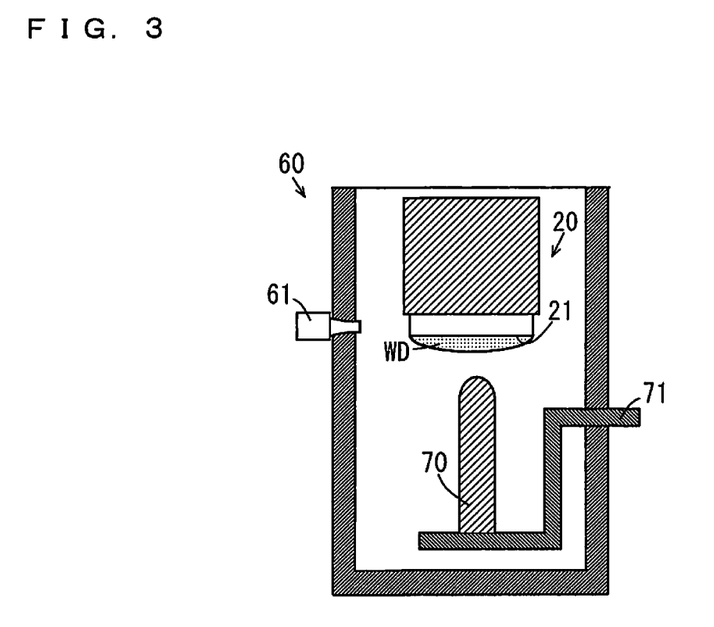
FIG. 3 is a schematic cross sectional view for explaining the transfer operation of the substrate cleaning device.

As shown in FIG. 2, in the waiting pod 60, a cleaning liquid WL is first supplied from the cleaning nozzle 61 into the waiting pod 60. In the present example, the cleaning liquid WL is discharged from the cleaning nozzle 61 into the waiting pod 60 in a horizontal direction. Thus, the cleaning liquid WL is supplied to the cleaning surface 21 of the cleaning brush 20. The cleaning brush 20 is rotated about the axis extending in the vertical direction, so that the cleaning surface 21 of the cleaning brush 20 is cleaned with the cleaning liquid WL. When cleaning for the cleaning surface 21 is finished, rotation of the cleaning brush 20 is stopped. At this time, as shown in FIG. 3, droplets WD of the cleaning liquid WL adhere to the cleaning surface 21 due to the surface tension of liquid.

Figure 4:
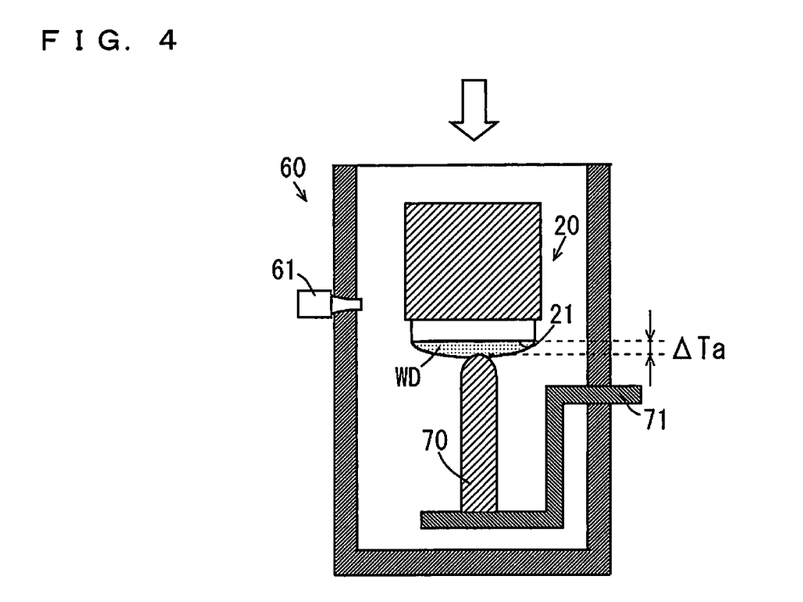
FIG. 4 is a schematic cross sectional view for explaining the transfer operation of the substrate cleaning device.

Next, as shown in FIG. 4, after the cleaning surface 21 of the cleaning brush 20 is cleaned, the controller 80 controls the arm driver 40 to lower the cleaning brush 20 such that the cleaning surface 21 keeps a predetermined distance ΔTa from the upper end surface of the fixed remover 70. The distance ΔTa is set larger than 0, and equal to or smaller than the thickness in an up-and-down direction of the droplets WD adhering to the cleaning surface 21.

Figure 5:
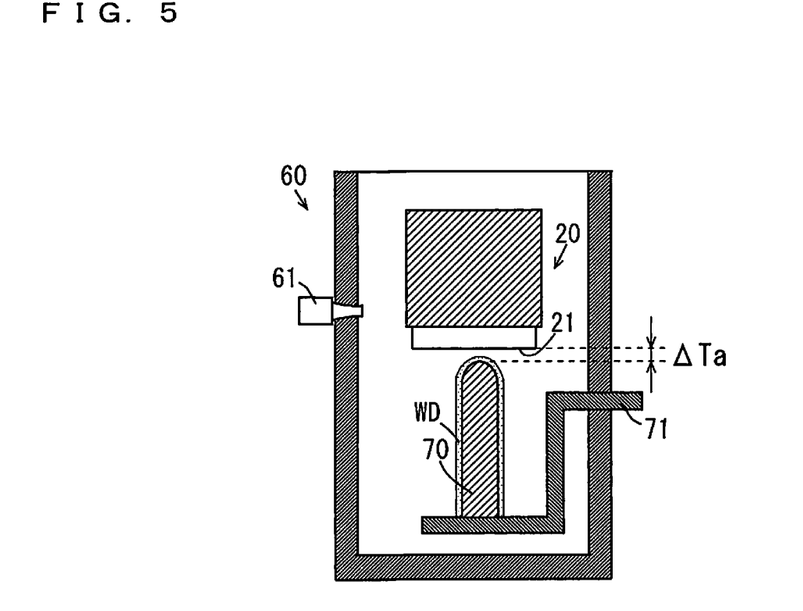
FIG. 5 is a schematic cross sectional view for explaining the transfer operation of the substrate cleaning device.

Therefore, when the cleaning brush 20 is lowered, part of the droplets WD adhering to the cleaning surface 21 comes into contact with the upper end surface of the remover 70. Thus, as shown in FIG. 5, at least part of the droplets WD adhering to the cleaning surface 21 is transferred to the remover 70. Thereafter, the cleaning brush 20 is moved to a position above the substrate W and is then lowered. Thus, the cleaning surface 21 comes into contact with the upper surface of the substrate W, and the upper surface of the substrate W rotated by the spin chuck 10 is cleaned by the rotating cleaning surface 21.

The thickness of the droplets WD in the up-and-down direction varies depending on a cleaning condition such as an area of the cleaning surface 21, viscosity of the cleaning liquid and hydrophilicity of the cleaning surface 21. As such, the distance ΔTa is determined by a teaching operation performed by an operator at the time of installation or maintenance of the substrate cleaning device 100, for example. The distance ΔTa is preferably set to 0.5 mm to 1.0 mm, for example.

(3) EFFECTS OF THE EMBODIMENTS

With the above-mentioned configuration, the cleaning surface 21 of the cleaning brush 20 and the remover 70 move close to each other before the substrate W is cleaned by the cleaning brush 20. Thus, droplets adhering to the cleaning surface 21 are transferred to the remover 70 and removed from the cleaning surface 21. Thus, when the cleaning brush 20 moves from the waiting position to the cleaning position for cleaning the upper surface of the substrate W, droplets adhering to the cleaning surface 21 of the cleaning brush 20 are prevented from falling and being splashed on the surface of the substrate W. This suppresses degradation of the cleanliness of the substrate W due to splashing droplets. As a result, the substrate cleaning device 100 can clean the substrate W so as to obtain a higher level of cleanliness with a simple configuration.

Further, because the remover 70 is formed in part of the waiting pod 60, an additional space for provision of the remover 70 is not required. Thus, miniaturization of the substrate cleaning device 100 is not prevented, and the substrate cleaning device 100 is not prevented from being made compact.

Further, because the remover 70 is formed in the waiting pod 60, droplets transferred to the remover 70 can be collected in the waiting pod 60. Thus, it is not necessary to provide a mechanism for collecting droplets outwardly of the waiting pod 60. As a result, complication of the configuration of the substrate cleaning device 100 is suppressed.

Further, the operation of moving the cleaning brush 20 from the waiting position to the cleaning position above the substrate W and the transfer operation can be performed only by an operation of the arm driver 40. This can suppress an increase in number of components.

Further, because the transfer operation is performed with the cleaning surface 21 and the remover 70 not coming into contact with each other and maintaining the distance ΔTa from each other, generation of particles due to the contact between the cleaning surface 21 and the remover 70 is prevented. Further, transfer of contaminants such as particles from the remover 70 to the cleaning surface 21 is prevented.

(4) MODIFIED EXAMPLES (4-1) First Modified Example

Figure 6:
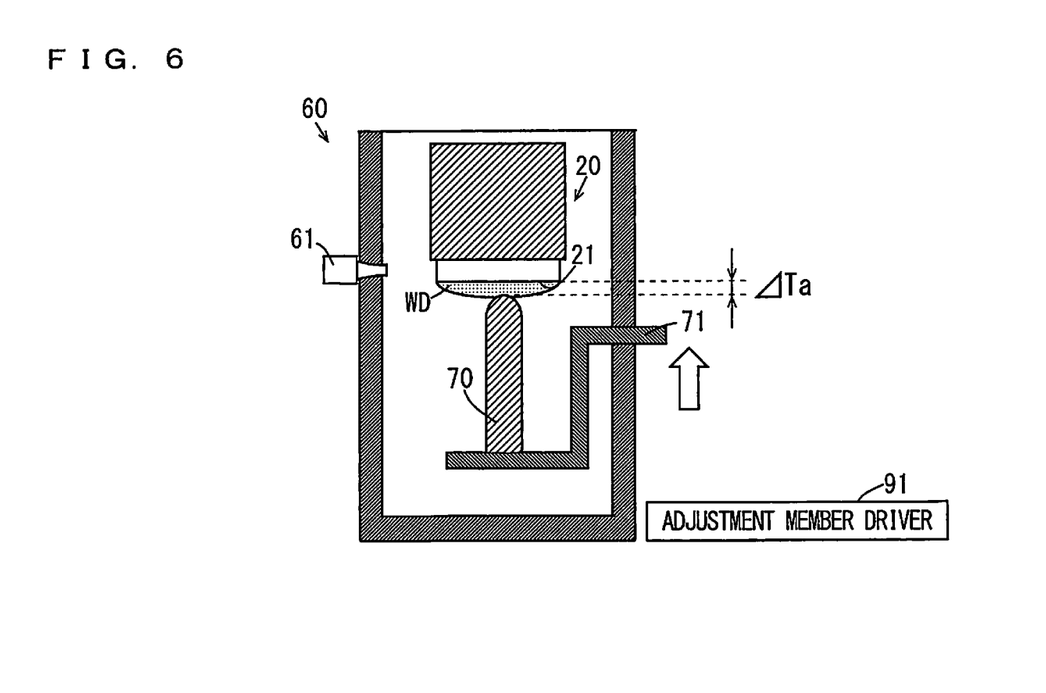
FIG. 6 is a schematic cross sectional view mainly showing a waiting pod and a remover according to a first modified example.

While the cleaning brush 20 is moved such that the cleaning surface 21 keeps the predetermined distance ΔTa from the fixed remover 70 in the above-mentioned embodiment, the present invention is not limited to this. FIG. 6 is a schematic cross sectional view mainly showing a waiting pod 60 and a remover 70 according to a first modified example. In the first modified example, an adjustment member driver 91 controlled by a controller 80 is further included in the configuration of the substrate cleaning device 100 of FIG. 1. The adjustment member driver 91 includes a motor or the like capable of moving an adjustment member 71 upwardly and downwardly.

In this case, the controller 80 controls an arm driver 40 and the adjustment member driver 91 to move both of a cleaning brush 20 and a remover 70 such that a cleaning surface 21 of the cleaning brush 20 and the remover 70 keep a predetermined distance ΔTa from each other. Alternatively, the controller 80 controls the adjustment member driver 91 to move the remover 70 such that the remover 70 keeps the predetermined distance ΔTa from the cleaning surface 21 of the cleaning brush 20 fixed at any position.

With this configuration, because the remover 70 can be moved independently of an operation of the arm driver 40, it is possible to easily adjust the operation of the arm driver 40.

(4-2) Second Modified Example

Figure 7:
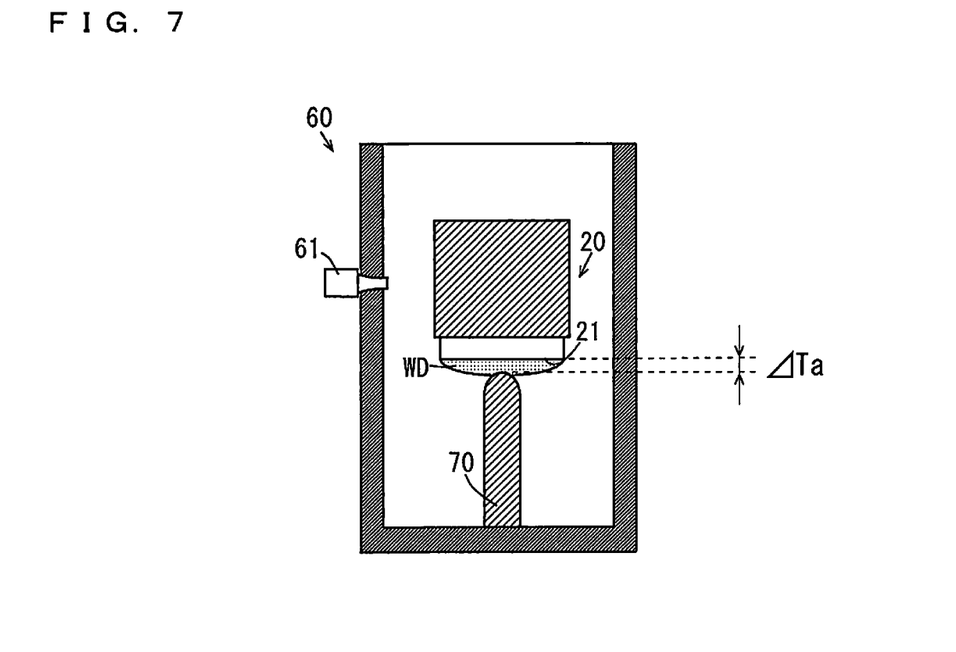
FIG. 7 is a schematic cross sectional view mainly showing the configurations of a waiting pod and a remover according to a second modified example.

While the remover 70 is formed integrally with the adjustment member 71 in the waiting pod 60 in the above-mentioned embodiment, the present invention is not limited to this. FIG. 7 is a schematic cross sectional view mainly showing the configuration of a waiting pod 60 and a remover 70 according to a second modified example. In the second modified example, as shown in FIG. 7, the remover 70 is fixed to the bottom portion of the waiting pod 60, for example. In this case, because an adjustment member 71 is not required, the remover 70 can be easily formed. Further, it is possible to suppress an increase in size of the waiting pod 60 in the horizontal direction.

(4-3) Third Modified Example

Figure 8:
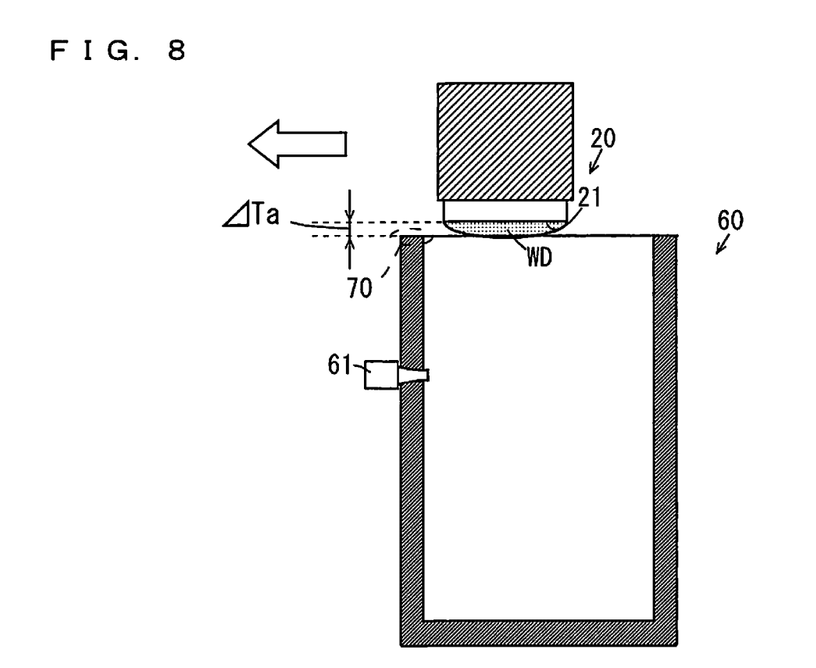
FIG. 8 is a schematic cross sectional view mainly showing the configurations of a waiting pod and a remover according to a third modified example.

FIG. 8 is a schematic cross sectional view mainly showing the configuration of a waiting pod 60 and a remover 70 according to a third modified example. In the third modified example, as shown in FIG. 8, the upper end surface of the sidewall of the waiting pod 60 located in the movement path of a cleaning brush 20 from the inside (waiting position) of the waiting pod 60 to above a substrate W is used as the remover 70. The remover 70 formed in at least part of the waiting pod 60 may be formed of a hydrophilic material or coated with a hydrophilic material.

An arm driver 40 moves the cleaning brush 20 such that a cleaning surface 21 keeps a predetermined distance ΔTa from the remover 70 at the upper end surface of the waiting pod 60 when the cleaning brush 20 is moved from the inside (waiting position) of the waiting pod 60 to above a substrate W. In this case, because the upper end surface of the waiting pod 60 is used as the remover 70, it is not necessary to provide the configuration of the remover 70 separately from the waiting pod 60. Therefore, droplets WD adhering to the cleaning surface 21 can be transferred only with simple control.

(4-4) Fourth Modified Example

Figure 9:
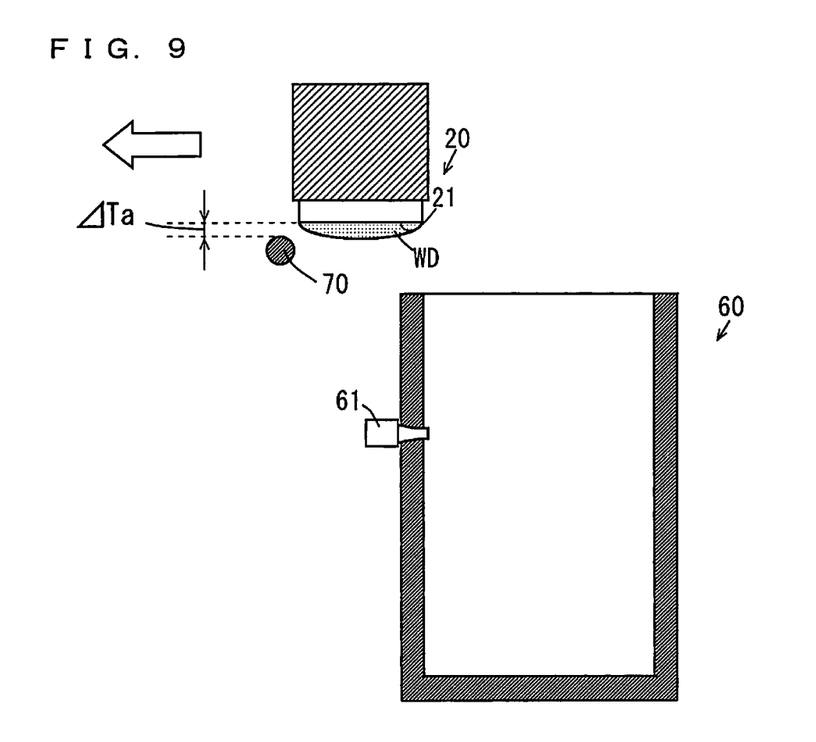
FIG. 9 is a schematic cross sectional view mainly showing the configurations of a waiting pod and a remover according to a fourth modified example.

FIG. 9 is a schematic cross sectional view mainly showing the configuration of a waiting pod 60 and a remover 70 according to a fourth modified example. In the fourth modified example, as shown in FIG. 9, in a substrate cleaning device 100, a remover 70 formed of a bar-shaped member is provided in the movement path of a cleaning brush 20 from the inside (waiting position) of the waiting pod 60 to above a substrate W. In the present example, the remover 70 is arranged so as to intersect with the movement path of the cleaning brush 20.

In this case, an arm driver 40 moves the cleaning brush 20 such that a cleaning surface 21 keeps a predetermined distance $\Delta Ta$ from the remover 70 when the cleaning brush 20 is moved from the inside (waiting position) of the waiting pod 60 to above a substrate W. Thus, it is possible to transfer droplets WD adhering to the cleaning surface 21 when the cleaning brush 20 is moved from the inside of the waiting pod 60 (waiting position) to the position for cleaning the substrate W. Therefore, it is possible to transfer the droplets WD adhering to the cleaning surface 21 with simple control. The remover may be configured to be movable to keep the predetermined distance $\Delta Ta$ from the cleaning surface 21 with the cleaning brush 20 being stationary at a predetermined position.

(4-5) Fifth Modified Example

Figure 10:
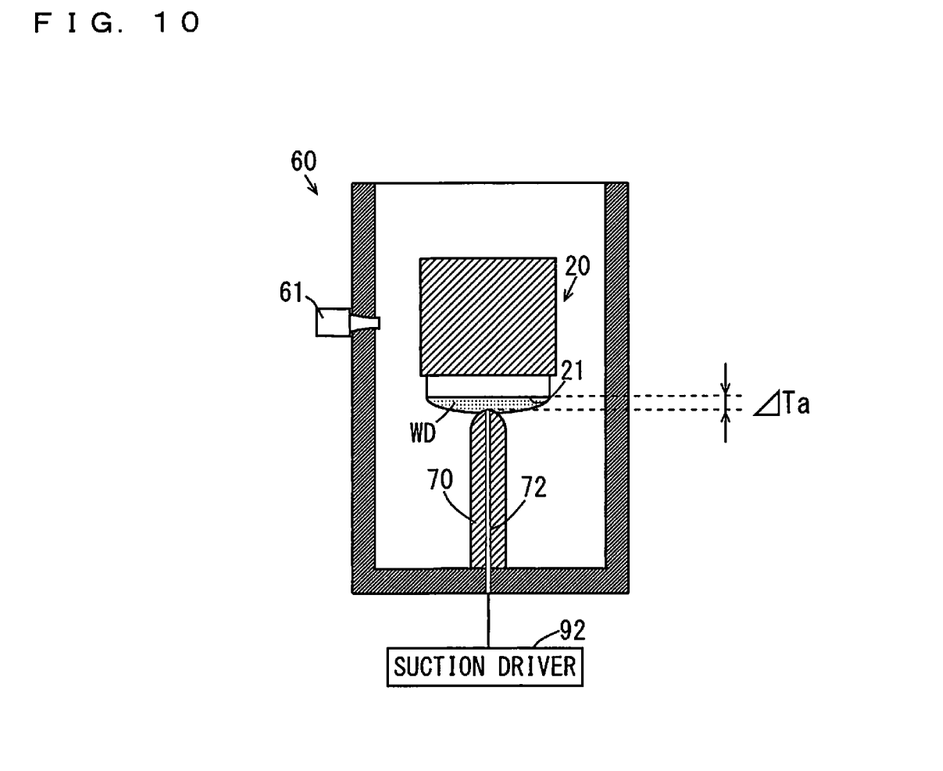
FIG. 10 is a schematic cross sectional view mainly showing the configurations of a waiting pod and a remover according to a fifth modified example.

FIG. 10 is a schematic cross sectional view mainly showing a waiting pod 60 and a remover 70 according to a fifth modified example. In FIG. 10, the vertical cross section of the remover 70 is shown. In the fifth modified example, as shown in FIG. 10, a suction driver 92 controlled by a controller 80 is further provided in addition to the remover 70 of FIG. 7.

Inside of the remover 70, a flow path 72 that penetrates the bottom portion of the waiting pod 60 from the upper end surface of the remover 70 is formed. A suction driver 92 is connected to the flow path 72. The suction driver 92 is a vacuum pump, for example. In this case, droplets WD adhering to a cleaning surface 21 are sucked by the suction driver 92 with a cleaning surface 21 keeping a predetermined distance $\Delta Ta$ from the remover 70.

With this configuration, even in a case in which the distance $\Delta Ta$ between the cleaning surface 21 and the remover 70 changes due to a change of the cleaning surface 21 over time, the droplets WD can be transferred from the cleaning surface 21 to the remover 70. Further, even in a case in which the thickness in the up-and-down direction of the droplets WD adhering to the cleaning surface 21 is smaller than the distance $\Delta Ta$, it is possible to transfer the droplets WD from the cleaning surface 21 to the remover 70. Therefore, it is possible to remove the droplets WD in various sizes adhering to the cleaning surface 21 from the cleaning surface 21. The flow path 72 may be provided in the remover 70 of FIGS. 1 to 7. In this case, the flow path 72 is connected to the suction driver 92 through the adjustment member 71.

(4-6) Sixth Modified Example

Figure 11:
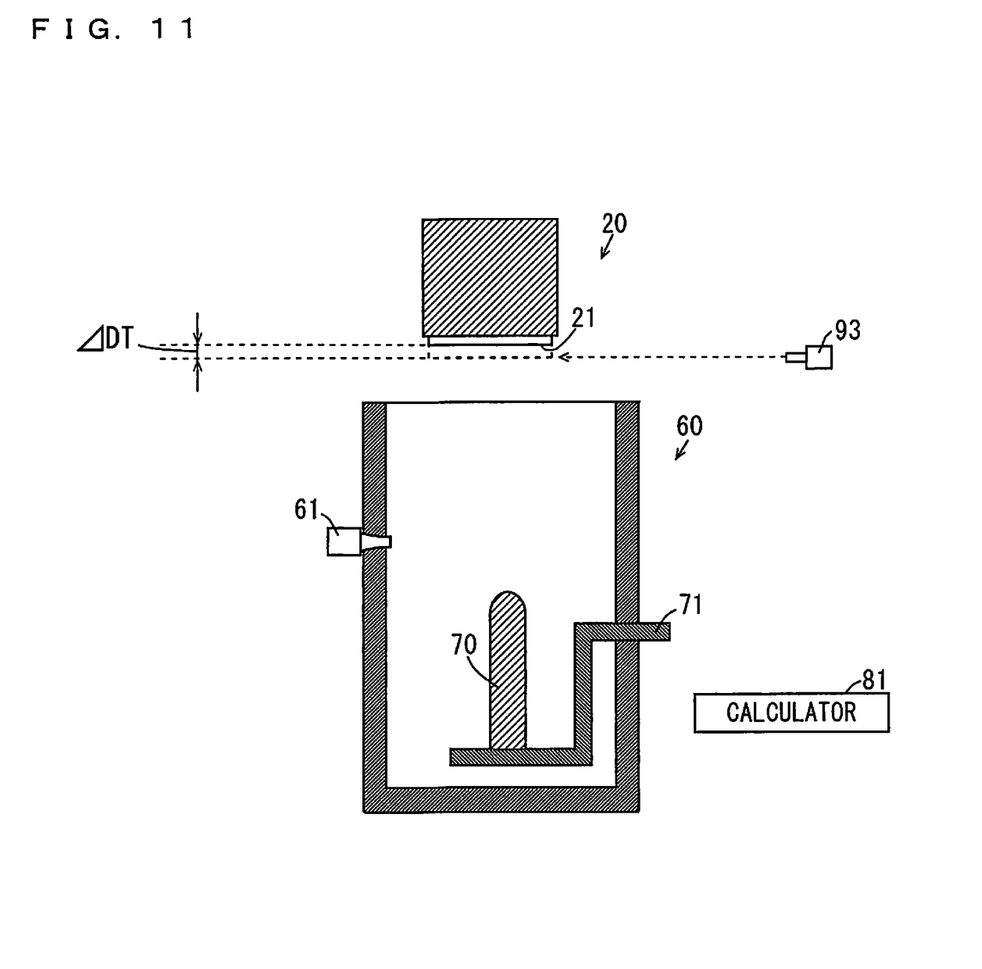
FIG. 11 is a schematic cross sectional view mainly showing the configurations of a waiting pod and a remover according to a sixth modified example.

FIG. 11 is a schematic cross sectional view mainly showing the configuration of a waiting pod 60 and a remover 70 according to a sixth modified example. While the predetermined distance $\Delta Ta$ is determined by a teaching operation performed by an operator in the above-mentioned embodiment, the present invention is not limited to this. In the sixth modified example, as shown in FIG. 11, a substrate cleaning device 100 further includes a detector 93 that is controlled by a controller 80. The detector 93 includes a transmission-type or reflection-type position sensor that detects the presence or absence of an object using laser light, for example. The controller 80 includes a calculator 81 that calculates the distance $\Delta Ta$. The calculator 81 is implemented by execution of a transfer operation program stored in a ROM or a storage device by the CPU of the controller 80. Further, the calculator 81 may be implemented by hardware such as an electronic circuit. Separately from the above-mentioned transfer operation, the detector 93 detects a cleaning surface 21 of a cleaning brush 20 located at a predetermined height. This enables detection of a change amount $\Delta DT$ (an amount of wear, for example) of the cleaning surface 21 due to long-term use. The calculator 81 calculates the relative positional relationship between the cleaning brush 20 and the remover 70 based on the change amount $\Delta DT$ of the cleaning surface 21 such that the distance between the cleaning surface 21 and the remover 70 is maintained at the distance $\Delta Ta$. The controller 80 controls an arm driver 40 based on the positional relationship calculated by the calculator 81 during a transfer operation. The detector 93 may detect a change amount (amount of wear) of the remover 70. In this case, the calculator 81 calculates the relative positional relationship between the cleaning brush 20 and the remover 70 based on the change amount of the remover 70 such that the distance between the cleaning surface 21 and the remover 70 is maintained at the distance $\Delta Ta$.

With this configuration, even in a case in which at least one of the cleaning surface 21 and the remover 70 is worn due to long-term use, the distance between the cleaning surface 21 and the remover 70 can be maintained constant during a transfer operation. Therefore, it is possible to remove droplets from the cleaning surface 21 over a long period of time.

(5) Other Embodiments (5-1) While the cleaning brush 20 is used to clean the upper surface of the substrate W in the above-mentioned embodiment, the present invention is not limited to this. For example, the cleaning brush 20 may be used to clean another surface such as a bevel region of the substrate W.

(5-2) While a transfer operation is performed when the cleaning surface 21 and remover 70 come close to each other so as to maintain the distance $\Delta Ta$ in the above-mentioned embodiment, the present invention is not limited to this. For example, in a case in which particles do not adhere to the remover 70, or the like, a transfer operation may be performed with the cleaning surface 21 and the remover 70 being in contact with each other.

(5-3) While the plurality of slits SL are formed so as to extend from the upper end surface to the side surface of the remover 70 in the above-mentioned embodiment, the present invention is not limited to this. For example, in a case in which the remover 70 has a flat upper end surface, a plurality of slits SL may be formed only in the upper end surface. Further, a single slit SL may be formed in the remover 70, or a slit SL does not have to be formed.

(6) CORRESPONDENCES BETWEEN CONSTITUENT ELEMENTS IN CLAIMS AND PARTS IN PREFERRED EMBODIMENTS

In the following paragraphs, non-limiting examples of correspondences between various elements recited in the claims below and those described above with respect to various preferred embodiments of the present disclosure are explained. In the above-mentioned embodiment, the spin chuck 10 is an example of a substrate holder, the arm driver 40 and the adjustment member driver 91 are examples of a driver, the waiting pod 60 is an example of a container, and the flow path 72 and the suction driver 92 are examples of a sucker.

(7) OVERVIEW OF EMBODIMENTS (Item 1) A substrate cleaning device according to one aspect includes a substrate holder that holds a substrate, a cleaning brush that is provided to be movable between a cleaning position for cleaning the substrate held by the substrate holder and a waiting position outward of the substrate held by the substrate holder, and has a cleaning surface capable of cleaning the substrate held by the substrate holder, a remover that is configured such that liquid is transferrable to the remover, and a driver that moves at least one of the cleaning brush and the remover with respect to another one such that at least part of liquid adhering to the cleaning surface is transferred to the remover when the cleaning surface and the remover come close to each other at a position outward of a position above the substrate held by the substrate holder, before the substrate is cleaned by the cleaning brush.

With the substrate cleaning device according to item 1, before the substrate is cleaned by the cleaning brush, the cleaning surface of the cleaning brush and the remover come close to each other. Thus, droplets adhering to the cleaning surface are transferred to the remover and removed from the cleaning surface. Thus, when the cleaning brush is moved from the waiting position to the cleaning position, droplets adhering to the cleaning surface of the cleaning brush are prevented from falling and being splashed on the surface of the substrate. This suppresses degradation of the cleanliness of the substrate due to splashing droplets. As a result, it is possible to clean the substrate so as to obtain a higher level of cleanliness with a simple configuration.

(Item 2) The substrate cleaning device according to item 1, wherein the remover may be provided between the cleaning position and the waiting position, and the driver may move the cleaning brush from the waiting position to the cleaning position, and may move at least one of the cleaning brush and the remover such that the cleaning surface and the remover come close to each other, when the cleaning brush is moved from the waiting position to the cleaning position.

With the substrate cleaning device according to item 2, because the cleaning surface and the remover come close to each other when the cleaning brush is moved from the waiting position to the cleaning position, no additional period of time is required for the cleaning surface and the remover to come close to each other. Therefore, it is possible to remove droplets from the cleaning surface while suppressing an increase in period of time required for cleaning.

(Item 3) The substrate cleaning device according to item 1 or 2 may further include a container that contains the cleaning brush at the waiting position, wherein the remover may be formed in part of the container.

With the substrate cleaning device according to item 3, because the remover is formed in part of the container, an additional space for provision of the remover is not required. Thus, miniaturization of the substrate cleaning device is not prevented, and the substrate cleaning device is not prevented from being made compact.

(Item 4) The substrate cleaning device according to item 3, wherein the remover may be formed inside of the container.

With the substrate cleaning device according to item 4, droplets transferred to the remover can be collected in the container. Thus, it is not necessary to provide a mechanism for collecting droplets outwardly of the container. As a result, complication of the configuration of the substrate cleaning device is suppressed.

(Item 5) The substrate cleaning device according to item 4, wherein the driver may move the remover such that the cleaning surface and the remover come close to each other in the container.

With the substrate cleaning device according to item 5, the driver moves the remover independently of an operation of moving the cleaning brush from the waiting position to the cleaning position performed by a movement mechanism. Thus, it is possible to easily adjust an operation performed by the driver.

(Item 6) The substrate cleaning device according to item 4, wherein the driver may move the cleaning brush such that the cleaning surface and the remover come close to each other in the container, and may move the cleaning brush from the container to the cleaning position in order for the cleaning brush to clean the substrate.

With the substrate cleaning device according to item 6, the driver performs both of an operation of bringing the cleaning surface of the cleaning brush close to the remover in the container and an operation of moving the cleaning brush from the container to the cleaning position. Thus, it is not necessary to provide a driver for bringing the cleaning surface and the remover close to each other in addition to the movement mechanism for moving the cleaning brush from the container to the cleaning position. This can suppress an increase in number of components. Further, this suppresses an increase in space in a case in which the driver is provided separately from the movement mechanism.

(Item 7) The substrate cleaning device according to any one of items 4 to 6, wherein the remover may have a shape projecting with respect to the cleaning surface of the cleaning brush in the container from a bottom portion in the container.

With the substrate cleaning device according to item 7, an increase in size of the container in the horizontal direction can be suppressed.

(Item 8) The substrate cleaning device according to any one of items 1 to 7, wherein a sucker that sucks liquid from the cleaning surface when the cleaning surface and the remover come close to each other may be provided in the remover.

With the substrate cleaning device according to item 8, even in a case in which the distance between the cleaning surface and the remover varies, it is possible to transfer droplets from the cleaning surface to the remover. Further, even in a case in which being smaller than the distance between the cleaning surface and the remover, droplets adhering to the cleaning surface can be transferred from the cleaning surface to the remover. Therefore, it is possible to remove the droplets in various sizes adhering to the cleaning surface from the cleaning surface.

(Item 9) The substrate cleaning device according to any one of items 1 to 8, wherein the driver may move at least one of the cleaning brush and the remover such that a predetermined distance between the cleaning surface and the remover is maintained when the cleaning surface and the remover come close to each other.

With the substrate cleaning device according to item 9, the cleaning surface of the cleaning brush and the remover are prevented from coming into contact with each other. Thus, generation of particles due to the contact between the cleaning surface and the remover is suppressed. Further, contaminants adhering to the remover are prevented from being transferred to the cleaning surface. Therefore, the substrate can be cleaned with a cleaner cleaning brush in a clean atmosphere.

(Item 10) The substrate cleaning device according to item 9, may further include a detector that detects a position of the at least one of the cleaning brush and the remover when the cleaning surface and the remover come close to each other, and a controller that controls the driver based on a position detected by the detector such that the predetermined distance between the cleaning surface and the remover is maintained.

With the substrate cleaning device according to item 10, even in a case in which at least one of the cleaning surface and the remover is worn, the predetermined distance between the cleaning surface and the remover is maintained. Thus, it is possible to remove droplets from the cleaning surface over a long period of time.

(Item 11) The substrate cleaning device according to any one of items 1 to 10, wherein the remover may have a surface formed of a hydrophilic material.

With the substrate cleaning device according to item 11, because the remover has hydrophilicity, it is possible to further promote the transfer of droplets from the cleaning surface to the remover.

(Item 12) The substrate cleaning device according to any one of items 1 to 11, wherein the remover may have an opposing surface that is opposite to the cleaning surface when being close to the cleaning surface, and a plurality of slits may be formed in the opposing surface.

With the substrate cleaning device according to item 12, it is possible to easily transfer droplets adhering to the cleaning surface of the cleaning brush because of capillary action caused by a slit formed in the remover.

(Item 13) A substrate cleaning method according to another aspect includes holding a substrate with use of a substrate holder, cleaning a substrate held by the substrate holder with use of a cleaning surface of a cleaning brush, moving at least one of the cleaning brush and a remover with respect to another one such that at least part of liquid adhering to the cleaning surface is transferred to the remover when the cleaning surface and the remover come close to each other at a position outward of a position above the substrate held by the substrate holder, before the substrate is cleaned by the cleaning brush.

With the substrate cleaning method according to item 13, before the substrate is cleaned by the cleaning brush, the cleaning surface of the cleaning brush and the remover come close to each other. Thus, droplets adhering to the cleaning surface are transferred to the remover and removed from the cleaning surface. Thus, when the cleaning brush is moved from the waiting position to the cleaning position, droplets adhering to the cleaning surface of the cleaning brush are prevented from falling and being splashed on the surface of the substrate. This suppresses degradation of the cleanliness of the substrate due to splashing droplets. As a result, it is possible to clean the substrate so as to obtain a higher level of cleanliness with a simple configuration.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A substrate cleaning device comprising:
   a substrate holder that holds a substrate;
   a cleaning brush that is provided to be movable between a cleaning position for cleaning the substrate held by the substrate holder and a waiting position outward of the substrate held by the substrate holder, and has a cleaning surface capable of cleaning the substrate held by the substrate holder;
   a remover that is configured such that liquid is transferrable to the remover; and
   a driver that moves at least one of the cleaning brush and the remover with respect to another one such that at least part of liquid adhering to the cleaning surface is transferred to the remover when the cleaning surface and the remover come close to each other at a position outward of a position above the substrate held by the substrate holder, before the substrate is cleaned by the cleaning brush.

2. The substrate cleaning device according to claim 1, wherein
   the remover is provided between the cleaning position and the waiting position, and
   the driver moves the cleaning brush from the waiting position to the cleaning position, and moves at least one of the cleaning brush and the remover such that the cleaning surface and the remover come close to each other, when the cleaning brush is moved from the waiting position to the cleaning position.

3. The substrate cleaning device according to claim 1, further comprising a container that contains the cleaning brush at the waiting position, wherein
   the remover is formed in part of the container.

4. The substrate cleaning device according to claim 3, wherein
   the remover is formed inside of the container.

5. The substrate cleaning device according to claim 4, wherein
   the driver moves the remover such that the cleaning surface and the remover come close to each other in the container.

6. The substrate cleaning device according to claim 4, wherein
   the driver moves the cleaning brush such that the cleaning surface and the remover come close to each other in the container, and moves the cleaning brush from the container to the cleaning position in order for the cleaning brush to clean the substrate.

7. The substrate cleaning device according to claim 4, wherein
   the remover has a shape projecting with respect to the cleaning surface of the cleaning brush in the container from a bottom portion in the container.

8. The substrate cleaning device according to claim 1, wherein
   a sucker that sucks liquid from the cleaning surface when the cleaning surface and the remover come close to each other is provided in the remover.

9. The substrate cleaning device according to claim 1, wherein
   the driver moves at least one of the cleaning brush and the remover such that a predetermined distance between the cleaning surface and the remover is maintained when the cleaning surface and the remover come close to each other.

10. The substrate cleaning device according to claim 9, further comprising:
a detector that detects a position of the at least one of the cleaning brush and the remover when the cleaning surface and the remover come close to each other; and
a controller that controls the driver based on a position detected by the detector such that the predetermined distance between the cleaning surface and the remover is maintained.

11. The substrate cleaning device according to claim 1, wherein
the remover has a surface formed of a hydrophilic material.

12. The substrate cleaning device according to claim 1, wherein
the remover has an opposing surface that is opposite to the cleaning surface when being close to the cleaning surface, and a plurality of slits are formed in the opposing surface.

13. A substrate cleaning method including:
holding a substrate with use of a substrate holder;
cleaning a substrate held by the substrate holder with use of a cleaning surface of a cleaning brush;
moving at least one of the cleaning brush and a remover with respect to another one such that at least part of liquid adhering to the cleaning surface is transferred to the remover when the cleaning surface and the remover come close to each other at a position outward of a position above the substrate held by the substrate holder, before the substrate is cleaned by the cleaning brush.

* * * * *